United States Patent [19]
Limuti et al.

[11] Patent Number: 5,250,903
[45] Date of Patent: Oct. 5, 1993

[54] METHOD AND APPARATUS USING OSCILLATORY MAGNETIC FIELD TO DETERMINE STATE OF CHARGE OF AN ELECTROLYTIC STORAGE CELL

[75] Inventors: Donald Limuti, Kirkland; James M. Ross, Jr., Bothell; Thomas L. Churchill, North Bend, all of Wash.

[73] Assignee: Amoco Corporation, Chicago, Ill.

[21] Appl. No.: 851,984

[22] Filed: Mar. 13, 1992

Related U.S. Application Data

[63] Continuation of Ser. No. 359,642, May 31, 1989, Pat. No. 5,132,626.

[51] Int. Cl.$^5$ ............... G01N 27/416; G01N 27/72
[52] U.S. Cl. ..................................... 324/427; 324/204; 324/234; 324/436
[58] Field of Search ............... 324/426, 427, 430, 432, 324/434, 436, 204, 222, 234, 236–238; 340/636

[56] References Cited

U.S. PATENT DOCUMENTS

| | | | |
|---|---|---|---|
| 3,153,190 | 10/1964 | Spalding | 324/236 X |
| 3,230,447 | 1/1966 | Cann | 324/222 |
| 4,048,556 | 9/1977 | Roach et al. | 324/234 X |
| 4,859,940 | 8/1989 | Hummert et al. | 324/204 |
| 5,061,364 | 10/1991 | Metala et al. | 324/204 X |
| 5,093,624 | 3/1992 | Stevenson | 324/426 |

*Primary Examiner*—Gerard R. Strecker
*Attorney, Agent, or Firm*—Stephen G. Mican

[57] ABSTRACT

Nonintrusive sensors capable of measuring various storage cell parameters such as voltage, state-of-charge, electrolyte level, internal resistance, and temperature are attached to a monitoring module which gathers and processes signals representative of information concerning the condition of electrolytic storage cells and transmits the information to a central computer for further processing. In response to commands issued by the central computer, appropriate maintenance and/or repair operations can be initiated. Alternatively, the system described can be used to automatically perform such maintenance tasks as checking and adding electrolyte levels, reducing the voltage in cells whose output voltage is too high, and leveling the state-of-charge of each cell in an array of electrolytic storage cells. The system can monitor other functions of the electrolytic storage cells, including the evolution of hydrogen gas and the accumulation of sediments in individual electrolytic storage cells.

23 Claims, 18 Drawing Sheets

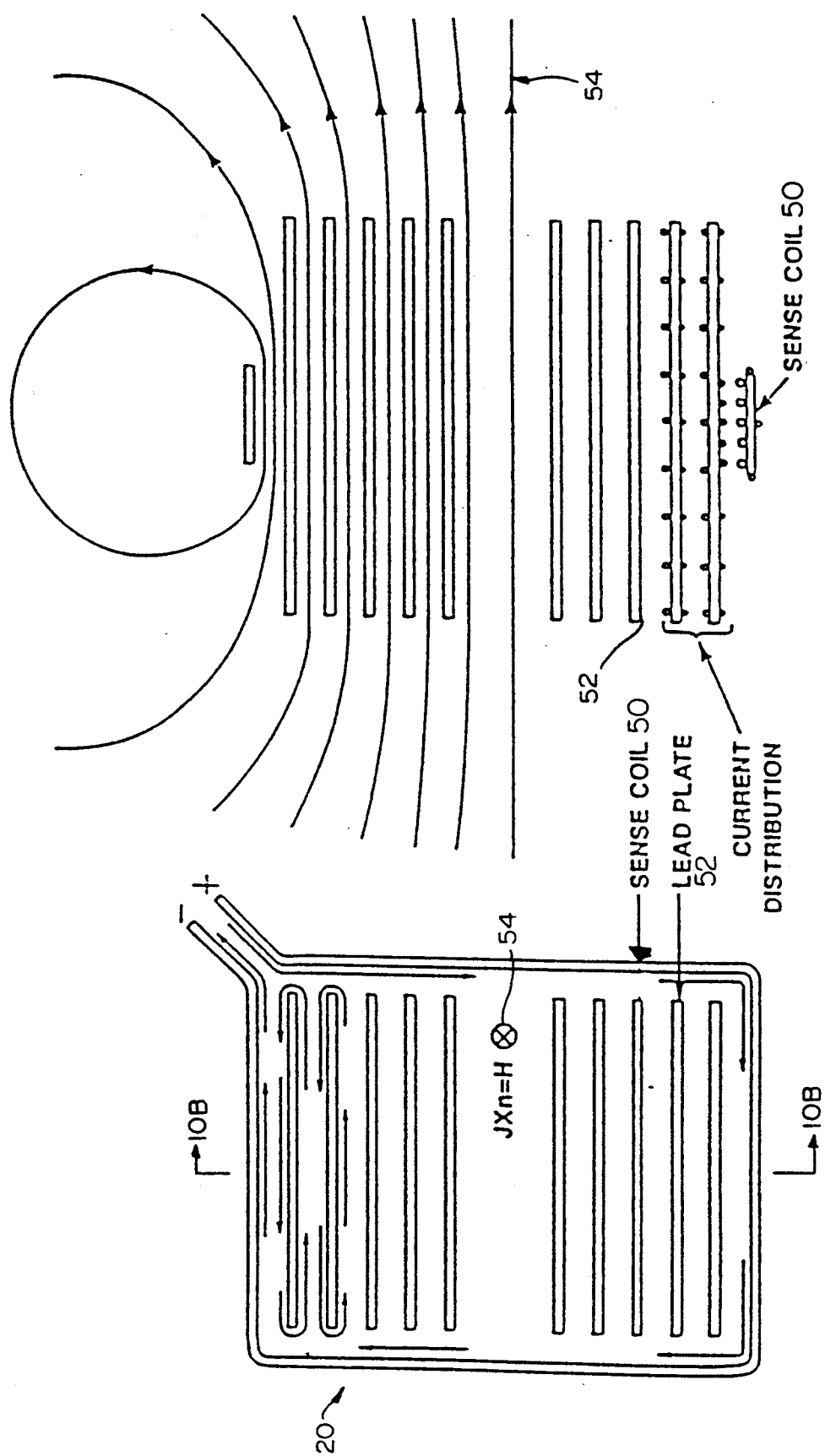

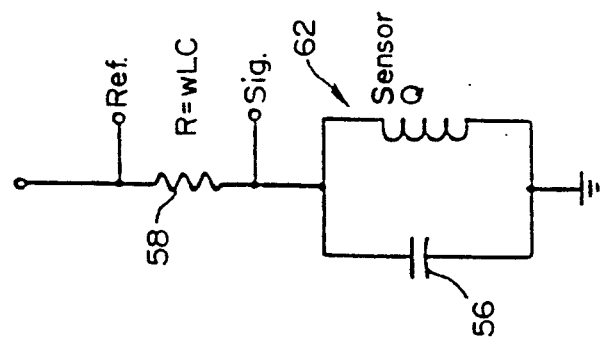
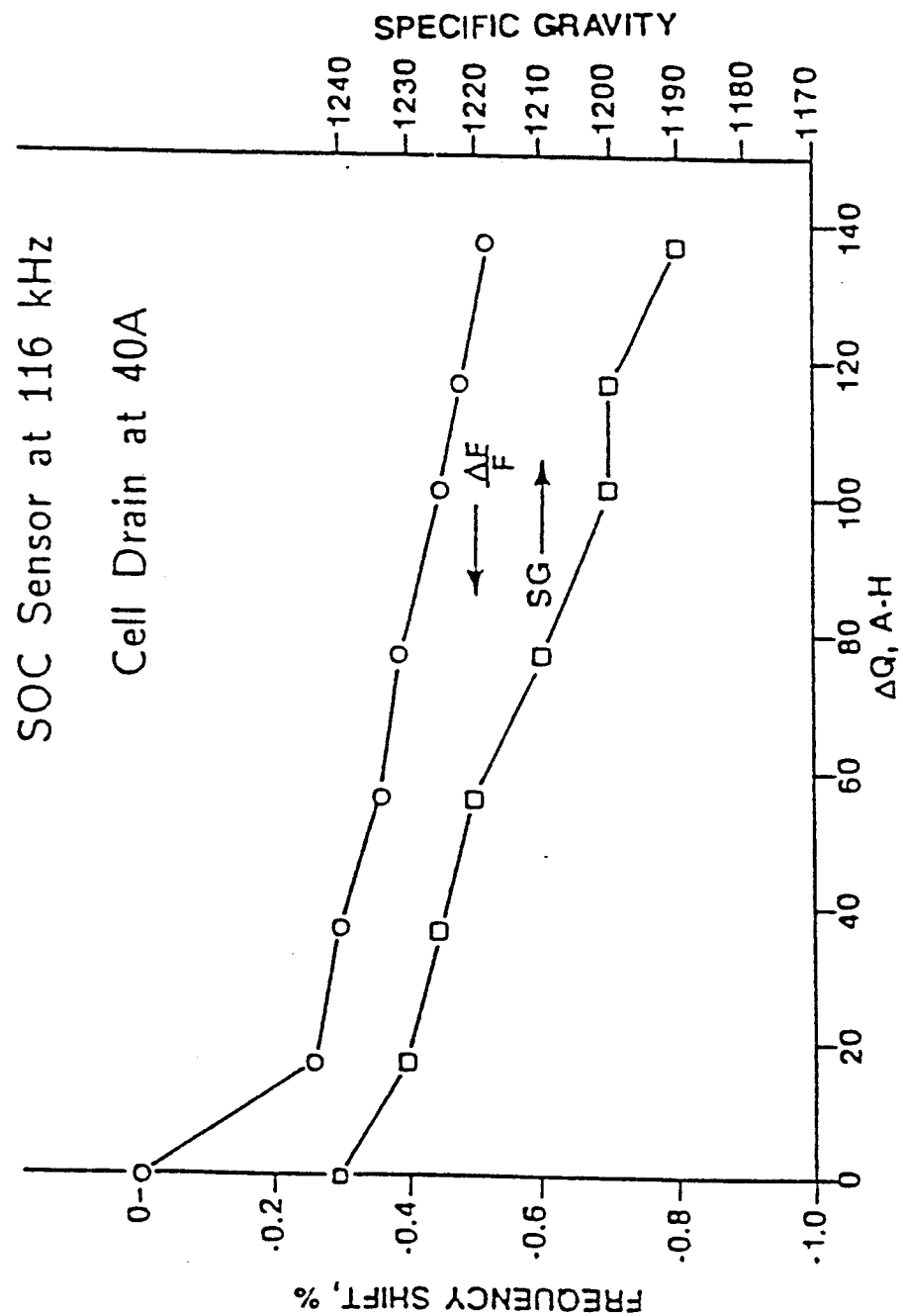
FIG. 11B
FIG. 11A

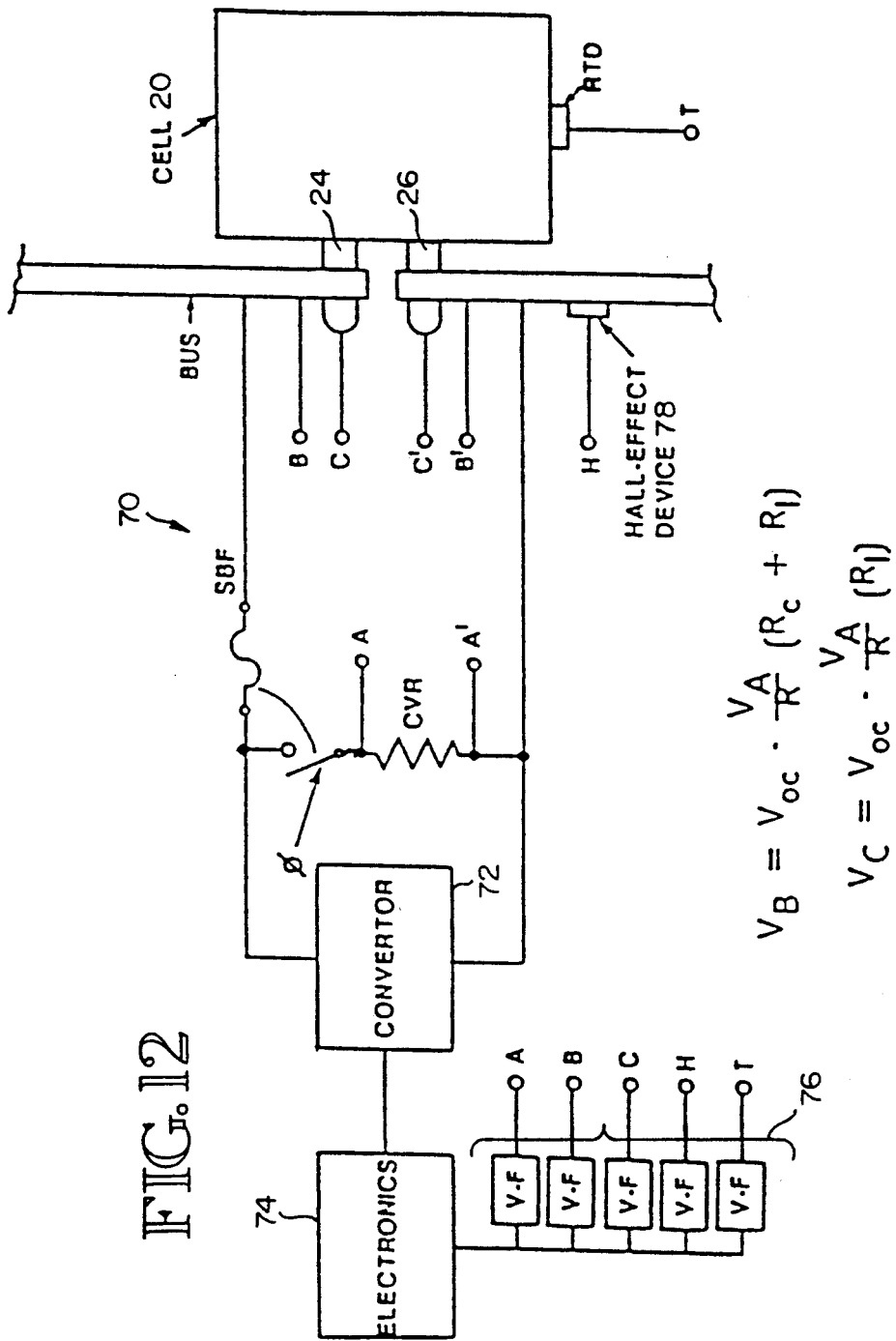

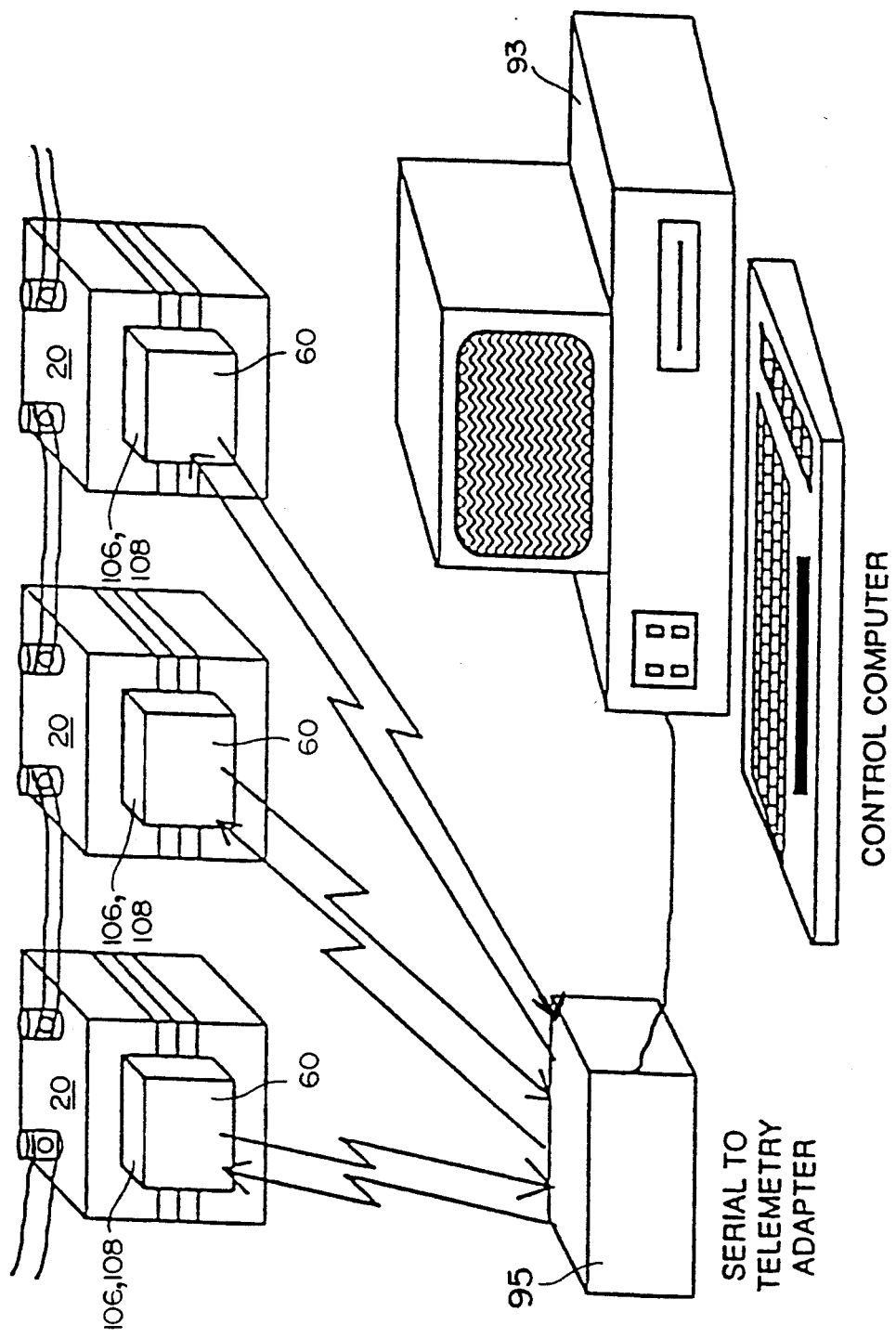

METHOD AND APPARATUS USING OSCILLATORY MAGNETIC FIELD TO DETERMINE STATE OF CHARGE OF AN ELECTROLYTIC STORAGE CELL

This is a continuation of application Ser. No. 07/359,642, filed May 31, 1989, now U.S. Pat. No. 5,132,626.

TECHNICAL FIELD

This invention relates to a monitoring system, and more particularly, to a system for monitoring a plurality of electrolytic storage cells.

BACKGROUND ART

Most major installations in the United States that use electrical power have backup systems in case the normal electrical supply becomes disabled. Typical examples include large office buildings, hospitals, public utility systems, and municipal facilities. Frequently, the source of the backup electrical power is a bank of interconnected electrolytic storage cells, such as the common lead-acid storage cell, which retain electrical charge for conversion to electrical current. Since it is often unpredictable when such systems will be called upon to supply their emergency function, it is critical that they be maintained at or near their greatest possible efficiency. Accordingly, the users of such systems have frequently put in place preventive maintenance and/or repair procedures.

Among the popular present methods for maintaining and/or repairing a large array of storage cells are: 1) to wait until some cell in the array fails; 2) to periodically replace the cells in the array, thereby reducing the chance that any one of the cells will fail when the array is called upon for its emergency purpose; or 3) to periodically test each cell in the array. A problem with the first method is that great expense can be incurred should the array fail when it is needed. A problem with second method is that it may be unnecessarily expensive and wasteful to periodically replace cells that may not be defective. A problem with the third method is that each individual cell must be separately checked with intrusive tests of the cell's electrolyte, which is typically a combination of various fluids such as water ($H_2O$) and sulfuric acid ($H_2SO_4$).

Accordingly, it would be useful to have a method for monitoring and maintaining such arrays when and only when such services are required.

DISCLOSURE OF THE INVENTION

It is an object of the present invention to provide an apparatus for nonintrusively monitoring electrolytic parameters of one or more electrolytic storage cells.

It is another object of the present invention to provide an apparatus for nonintrusively detecting the level of an electrolyte in a storage cell.

It is yet another object of the present invention to provide an apparatus for nonintrusively detecting the specific gravity of an electrolyte in a storage cell.

It is still another object of the present invention to provide an apparatus for nonintrusively detecting the state-of-charge of a storage cell.

Yet another object of the present invention is to provide an apparatus including one or more sensors that comprise a circuit for nonintrusively measuring the voltage, internal resistance, and the temperature of a storage cell.

Still another object of the present invention is to provide a system of storage cells, including a monitoring module attached to each storage cell and means for addressing each monitoring module to collect signals representing the electrolytic condition of each storage cell.

Still another object of the present invention is to provide a system including means for bringing the storage cells to a desired state of charge.

An even further object of the present invention is to provide an apparatus including means for nonintrusively measuring the evolution of byproducts resulting from charging the storage cell.

An even further object of the present invention is to provide an apparatus for measuring the level of sediment at the bottom of the enclosure of a storage cell.

Still another object of the present invention is to provide an apparatus for adjusting a level of the electrolyte in each storage cell in an array of storage cells.

An additional object of the present invention is to provide an apparatus for causing an array of storage cells to be brought to a desired state-of-charge by means of balancing the state-of-charge of each storage cell in the array of storage cells.

According to one aspect, the invention provides a system for monitoring electrolytic parameters of one or more electrolytic storage cells. The system includes a monitoring module associated with each electrolytic storage cell, means for addressing each monitoring module to collect the signals representative of the electrolytic condition of each storage cell, and means for processing the collected signals to monitor the condition of each storage cell.

Each monitoring module has one or more sensors attached to the associated storage cell, means for measuring the complex impedance of each of the attached sensors, and means for producing signals representative of the electrolytic parameters of the associated storage cell.

In another aspect, the present invention provides a system for monitoring electrolytic parameters of one or more electrolytic storage cells. The system comprises a monitoring module attached to each storage cell, means for addressing each monitoring module, and means for processing the collected signals to monitor the condition of each storage cell and generating the command signals in response to the condition of each storage cell.

Each monitoring module has means for generating a signal containing a predetermined frequency, coupling means for coupling the signal into each storage cell, a sensor attached to the associated storage cell, and means for measuring the complex impedance of the sensor at the predetermined frequency. Each monitoring module also includes means for producing signals representative of the electrolytic parameters of the associated storage cell, communication means for transmitting and receiving signals, and a microprocessor operating under the control of a program to send the signals representative of the electrolytic parameters of the associated storage cell to the communication means and to receive command signals from the communication means. The addressing means is for collecting the signals representative of the electrolytic condition of each storage cell and transmitting the command signals to the addressed monitoring module.

BRIEF DESCRIPTION OF THE FIGURES

FIG. 10A is a schematic diagram of a plan view of an embodiment of the apparatus of FIG. 9, exemplifying electrode flux exclusion.

FIG. 10B is a schematic diagram of a elevation view of an embodiment of the apparatus of FIG. 9, exemplifying electrode flux exclusion.

FIG. 11A is a graph of the specific gravity and percentage frequency shift of the apparatus shown in FIG. 9 as the storage cell is subjected to significant levels of current drain, up to ten percent beyond the storage cell's rated discharge capacity.

FIG. 11B is a schematic diagram of the test circuit used to obtain the data of FIG. 11A.

FIG. 12 is a schematic diagram of a cell voltage/cell resistance/cell temperature/bus-cell connection resistance monitoring circuit for use with an electrolytic storage cell.

FIG. 18 is a schematic diagram of the comprehensive cell monitoring system of the present invention.

DETAILED DESCRIPTION OF PREFERRED EMBODIMENTS

Figure 1:
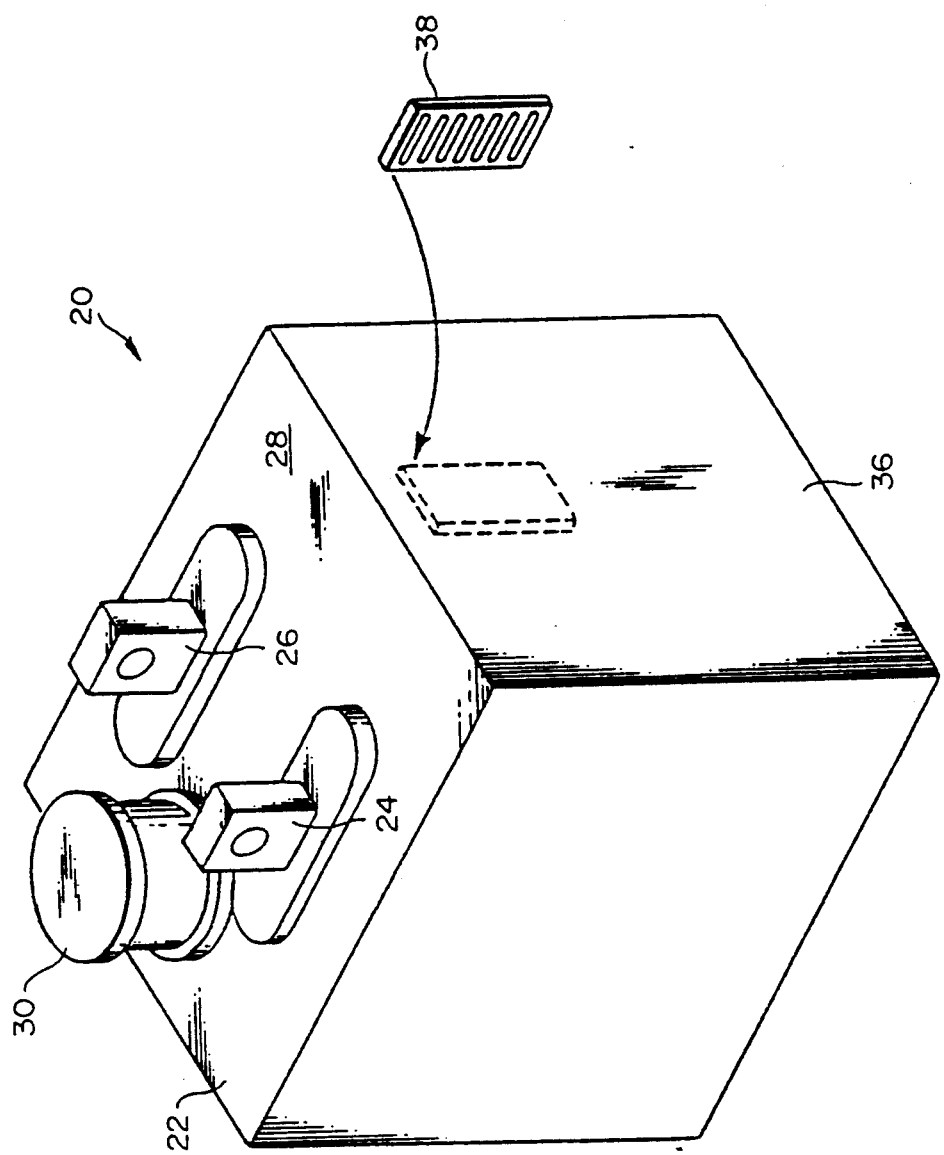
FIG. 1 is an isometric view of an electrolytic storage cell, showing a first embodiment of an apparatus for monitoring the electrolyte level of the storage cell.

Referring to the isometric view of FIG. 1, an electrolytic storage cell 20 is contained with an enclosure 22 having a positive terminal 24 and a negative terminal 26. The enclosure 22, which contains the electrolyte for the cell 20, can be either a separate enclosure for each cell or an enclosure containing two or more storage cells 20. The terminals 24 and 26 typically extend upwardly through an upper surface 28 of the enclosure 22. A cap 30 is also located on the upper surface 28. The cap 30 can be used to access the interior of the enclosure 22 to measure the specific gravity or other electrolytic parameters of the electrolytic cell, such as by the use of a conventional hydrometer, or to adjust a parameter of the electrolyte contained within the electrolytic storage cell 20. The cap 30 can be removed and replaced, according to whether the cell is to be tested or stored. As will be described below, the electrolytic storage cell 20 is configured to have its electrolyte monitored by an electrode array 38, which is a conventional printed circuit (PC) attached to the vertical surface 36.

Figure 2:
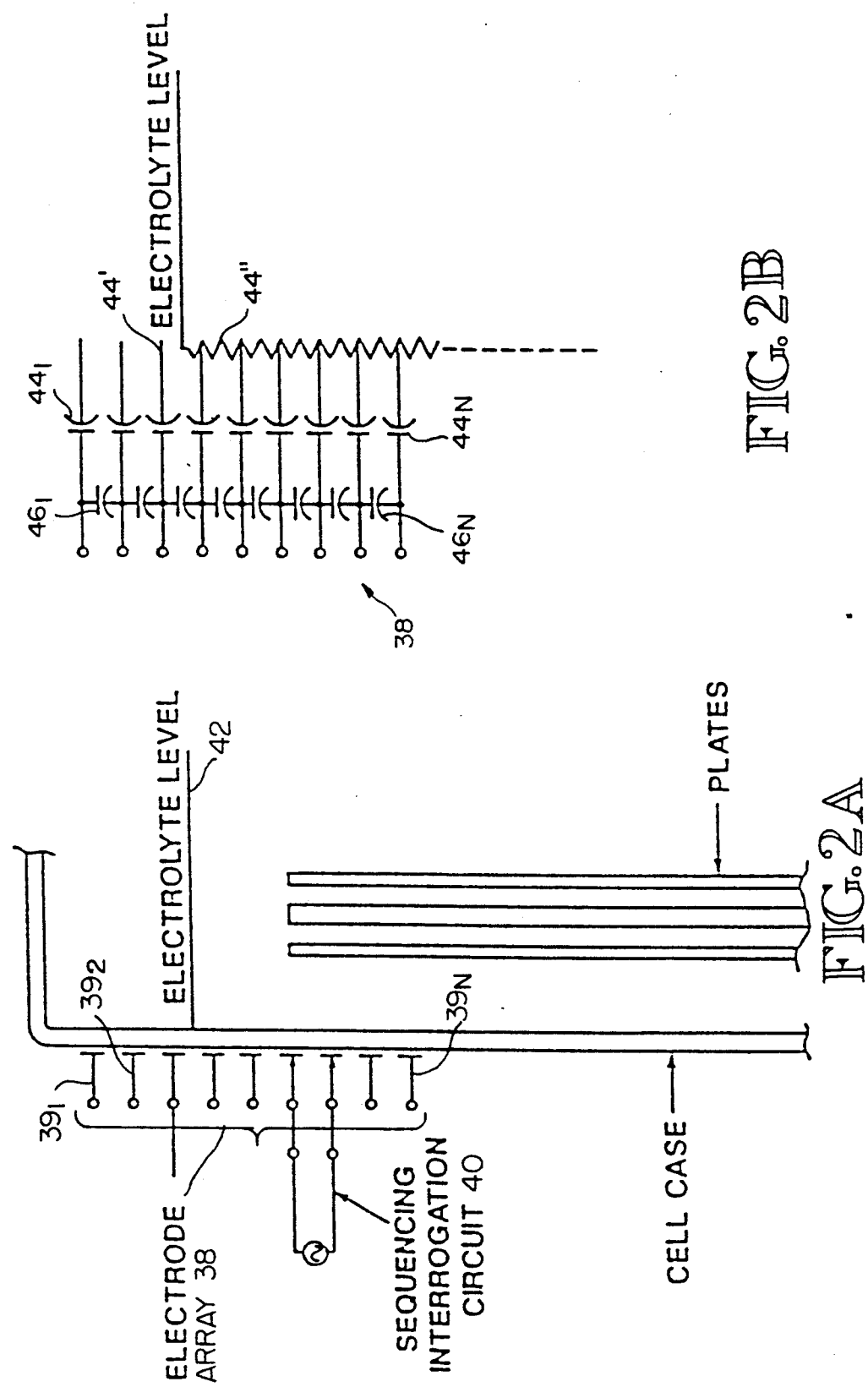
FIG. 2A is a schematic diagram of the capacitive electrolyte level monitor of FIG. 1.
FIG. 2B is a schematic diagram of the equivalent circuit of the capacitive electrolyte level monitor of FIG. 1.

FIGS. 2A and B are schematic diagrams of the capacitive electrolyte level monitor of FIG. 1 and of its equivalent circuit. The PC electrode array 38 includes a plurality of sequentially interrogated electrodes $39_1, \ldots 39_N$, each having a capacitance with respect to the other electrodes and to the electrolyte contained within electrolytic storage cell 20. The capacitance depends on the electrode's size and the composition and thickness of the wall of enclosure 22. If each electrode 39 is a copper strip approximately one inch long and 0.1 inch wide, its capacitance will be approximately 39 picofarads. The electrodes 39 are attached to the exterior vertical surface 36 of the storage cell 20. The electrodes $39_1, \ldots, 39_N$ serve the purpose of sinking electrical currents which differ depending on whether a sequencing interrogation circuit 40 is connected to two electrodes 39 which are both below an electrolyte level 42 of the electrolytic storage cell 20. Those electrodes 39 which are above the electrolyte level 42 do not affect the operation of the interrogation circuit 40.

Equivalently, the electrode array 38 of FIG. 2B can be viewed as taking the form of a number of series capacitors $44_1, \ldots, 44_N$, formed by the capacitance between each electrode 39 and the electrolyte separated by the cell case, and connected by means of a series of parallel capacitors $46_1, \ldots, 46_N$, formed by the stray capacitance between adjacent electrodes 39. The effective series capacitors 44 and the effective parallel capacitors 46 which are located below the electrolyte level 42 absorb more signal than do their counterparts above the electrolyte level because of the electrical "shorting" effect of the electrolyte. In effect, the capacitors formed by electrodes which are above the electrolyte level 42 do not contribute to the capacitance of the array 38. This can be detected as a change in the capacitance in the consecutive electrodes 39 on the electrode array 38. Accordingly, the electrolyte level 42 can be located with a precision that is equal to the separation between consecutive electrodes 39. If desired, electrode spacing can be varied in the electrode array 38 in order to achieve high precision location on the electrolyte level 42 when it is at certain levels and coarser precision at other electrolyte levels 42.

Figure 3:
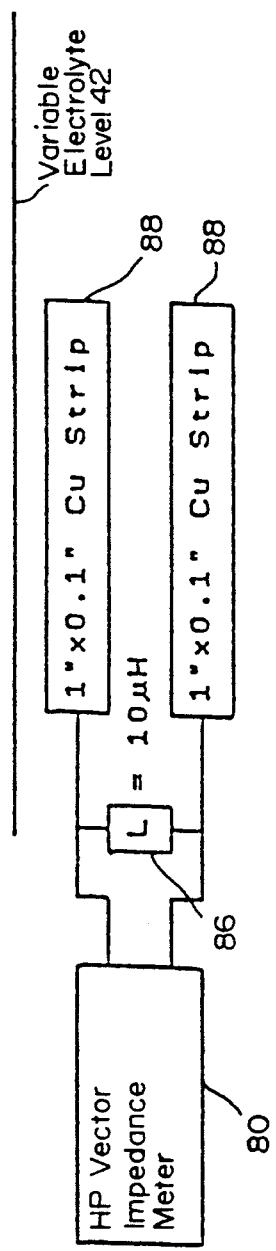
FIG. 3 is a schematic diagram of a circuit for measuring the electrolyte level in the electrolytic storage cell, in accordance with the embodiment of FIG. 1.

FIG. 3 is a schematic diagram of a first interrogation circuit 40 for measuring the electrolytic level in the electrolytic storage cell 20 by testing the capacitance of the consecutive electrodes 39 in the electrode array 38. The circuit 40 includes a vector impedance meter 80 which is connected to a parallel inductor 86 (having an inductance of approximately 10 microhenries) and, in turn, to a pair of 1"×0.1" copper strips 88. The vector impedance meter 80 both drives the inductors 86 and strips 88 at a controllable frequency and measures their combined impedance at that frequency. The vector impedance meter 80 can take the form of a conventional Hewlett-Packard impedance meter.

The copper strips 88 are arranged so that when the electrolyte level 42 is low both of the copper strips are above the electrolytic fluid and when the electrolyte level 42 is normal both strips are below the electrolytic fluid. It has been discovered that, for an approximate choice of the inductor 86, the resonant impedance of the circuit composed of the inductor 86, a pair of consecutive electrodes 39 (in the form of copper strips 88), the cell case, and the electrolyte contained within the cell case, varies considerably depending upon whether the electrodes 39 are both covered by the electrolyte or both exposed. If the electrolyte is above both electrodes, the resonant impedance of the circuit is 59 kilohms (at a resonant frequency of 25.9 MHz), while if the electrolyte is below both electrodes 39, the resonant impedance falls to 25 kilohms (at a resonant frequency of 26.5 MHz). It has also been discovered that exposing the electrodes 39 by tipping the cell requires approximately 15 minutes of evaporation time for the resonant impedance to stabilize to 25 kilohms.

Figure 4:
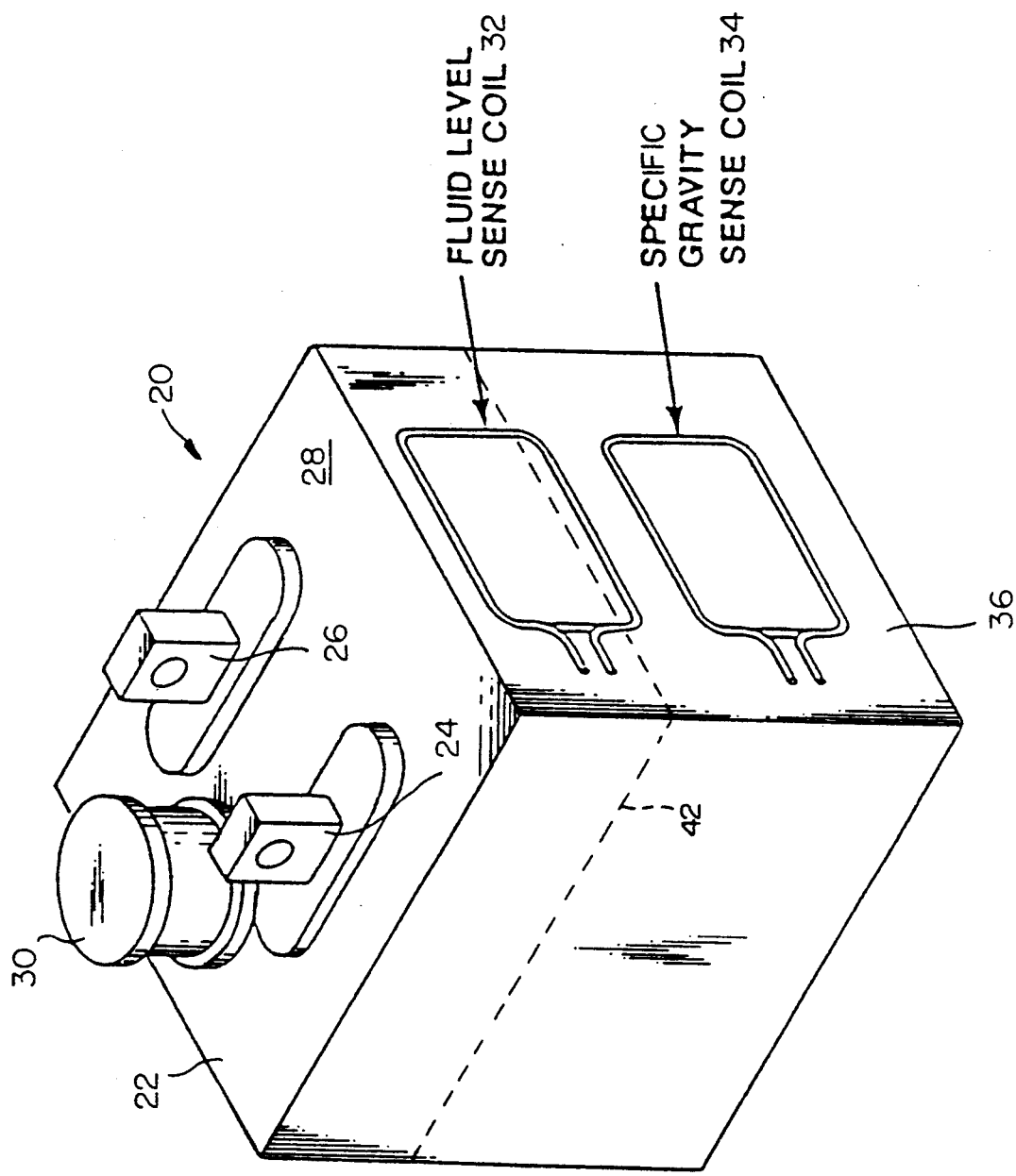
FIG. 4 is an isometric view of an electrolytic storage cell, showing a second embodiment of an apparatus for monitoring the electrolyte level of the storage cell and an embodiment of an apparatus for monitoring the specific gravity of the storage cell.

FIG. 4 is an isometric view of the electrolytic storage cell 20 configured to have its electrolyte monitored by two sense coils 32 and 34. Both the level and the specific gravity of the electrolyte can be monitored by the apparatus shown in FIG. 4. A fluid level sense coil 32 (which will be explained in greater detail subsequently) is attached to a vertical surface 36 of the enclosure 22 at a level which is within the range of electrolyte levels that can be expected in normal operation of the electrolyte storage cell 20. In addition, a specific gravity sense coil 34 is placed on the vertical surface 36 at a level to which it is not expected that the electrolyte level will fall.

FIG. 5A is a schematic diagram of the elevation view of the electrolyte level and specific gravity monitors of FIG. 4, FIG. 5B is a schematic diagram of an equivalent model of the electrolyte level and specific gravity monitors of FIG. 4, and FIG. 5C is a representative waveform of the response of the equivalent model of the electrolyte level and specific gravity monitors of FIG. 4.

The schematic diagram of FIG. 5A represents either of the sense coils 32 and 34 shown in FIG. 4. Only one coil is operated at a time when a monitor is making a measurement. The model of FIG. 5B consists of a collection of capacitors, resistors, and inductors. The model can be shown, by conventional transient circuit analysis of the actual and virtual (image) currents produced when the sense coil 32 or 34 is caused to resonate, to have a characteristic response in the form of a damped sinusoid. The sense coil 32 or 34 (FIG. 5A) generates an oppositely directed image current corresponding to its respective location. The image current is distributed along the inner surface of the enclosure 22 in such a way that it produces electromagnetic fields identical to those which would be produced by oppositely-directed currents at locations which are mirror images of the currents through the coil 32 or 34. The currents in the coil 32 or 34 are densest in the portions of the coil which are closest to the enclosure 22, and the image currents are densest along the portions of the enclosure 22 which are closest to the coil 32 or 34. Both the damping rate and the resonant frequency of the circuit (see FIG. 5C) are characteristic of aspects of the model. As can be shown by conventional analysis, the resistances of the copper ($R_{Cu}$) of the sense coil and the electrolyte ($R_{H2SO4}$) of the storage cell 20, as well as the inductance of the sense coil 32 or 34, contribute to the response shown in FIG. 5C. These can be related to the electrolyte level and the specific gravity of the electrolyte.

Figure 6:
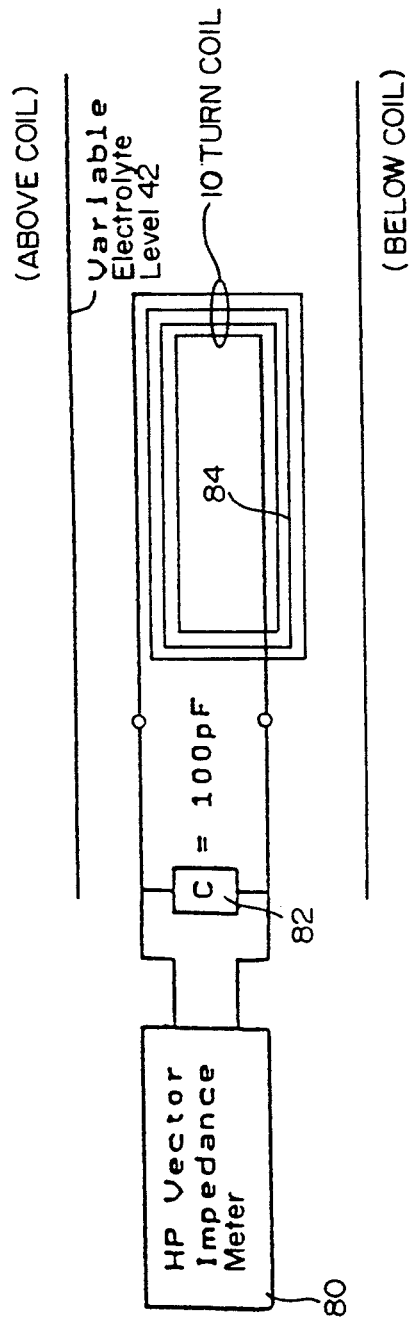
FIG. 6 is a schematic diagram of a circuit for measuring the electrolyte level in the electrolytic storage cell, in accordance with the embodiment of FIG. 4.

FIG. 6 is a schematic diagram of a circuit for measuring the electrolyte level in the electrolytic storage cell 20 by testing the circuit composed of the inductive sense coil 32. A vector impedance meter 80 produces a signal which is received by a capacitor 82 and a ten turn coil 84 (which can be rectangular, one inch high and two inches wide). If the fluid in the electrolytic storage cell 20 is above the coil 84, which is located on the side of the electrolytic cell, the circuit has a resonant impedance of 7.6 kilohms at 6.3 MHz. If, however, the fluid is below the coil 84, the circuit's resonant impedance rises to 22 kilohms at a frequency of 6.1 MHz. Since, as described above, the impedance of the circuit including the capacitor 82 and the coil 84 is dependent upon whether the coil 84 is above or below the level of the electrolyte, the electrolyte level can be determined by measurements of the circuit's resonant impedance. In experiments, it was noticed that the resonant impedance measurement stabilizes with no noticeable delay if the cell is tipped to place the fluid level below the two coils.

Figure 5:
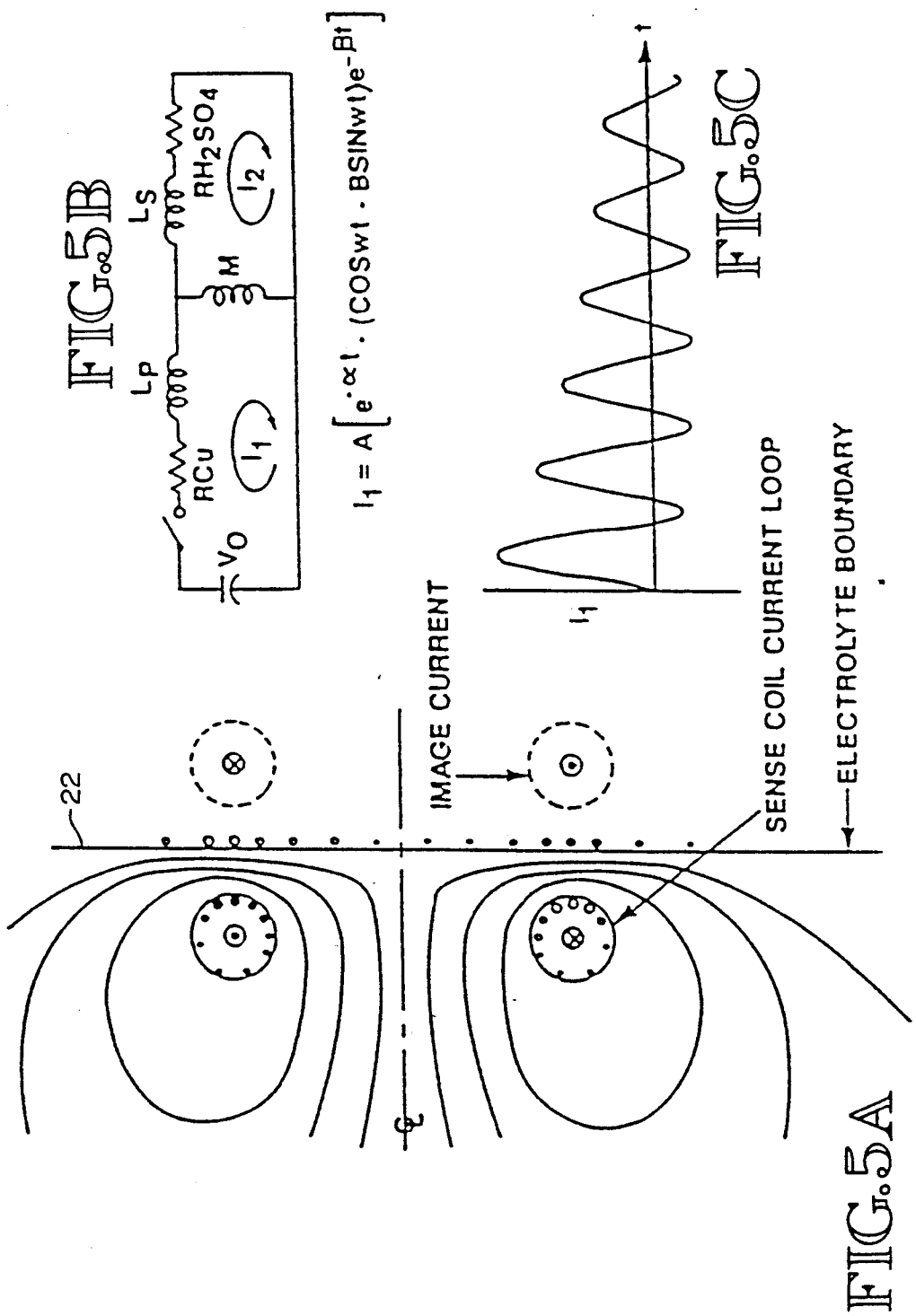
FIG. 5A is a schematic diagram of the elevation view of the electrolyte level and specific gravity monitors of FIG. 4.
FIG. 5B is a schematic diagram of an equivalent model of the electrolyte level and specific gravity monitors of FIG. 4.
FIG. 5C is a representative waveform of the response of the equivalent model of the electrolyte level and specific gravity monitors of FIG. 4.
Figure 7:
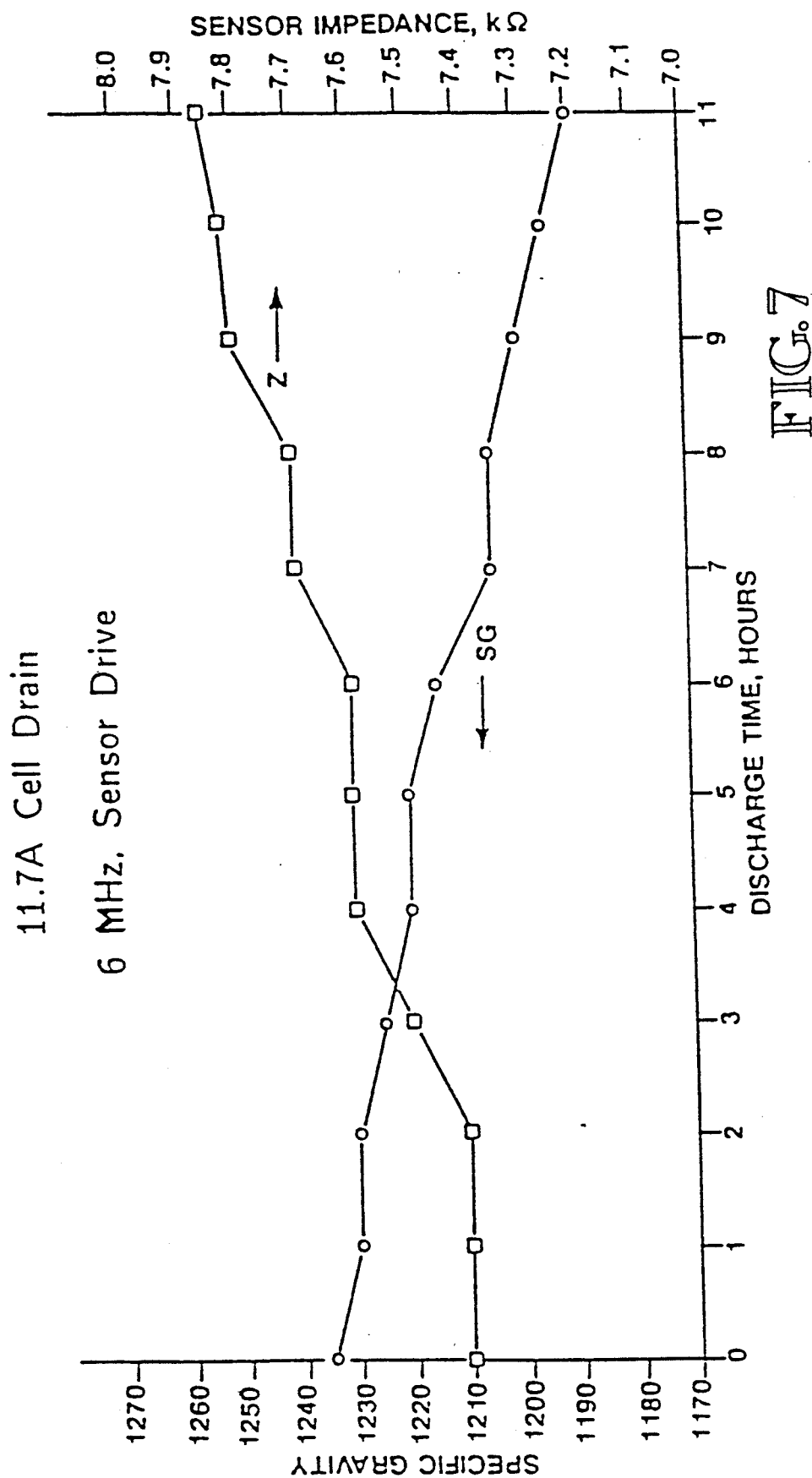
FIG. 7 is a graph of the specific gravity and sensor impedance measured in an evaluation of the second embodiment of the apparatus, as shown in FIG. 4.

FIG. 7 is a graph of the specific gravity and sensor impedance measured in an evaluation of the sense coil 34 (see FIG. 4), as the specific gravity of the electrolyte, as measured by a hydrometer, decreases. To collect the data, the circuit shown in FIG. 5 is driven by a sinusoidal voltage at a frequency of approximately 6 MHz. The specific gravity decreases while the sensor impedance increases progressively with elapsed discharge time over a period of eleven hours at a discharge current of 11.7 amperes.

Figure 8:
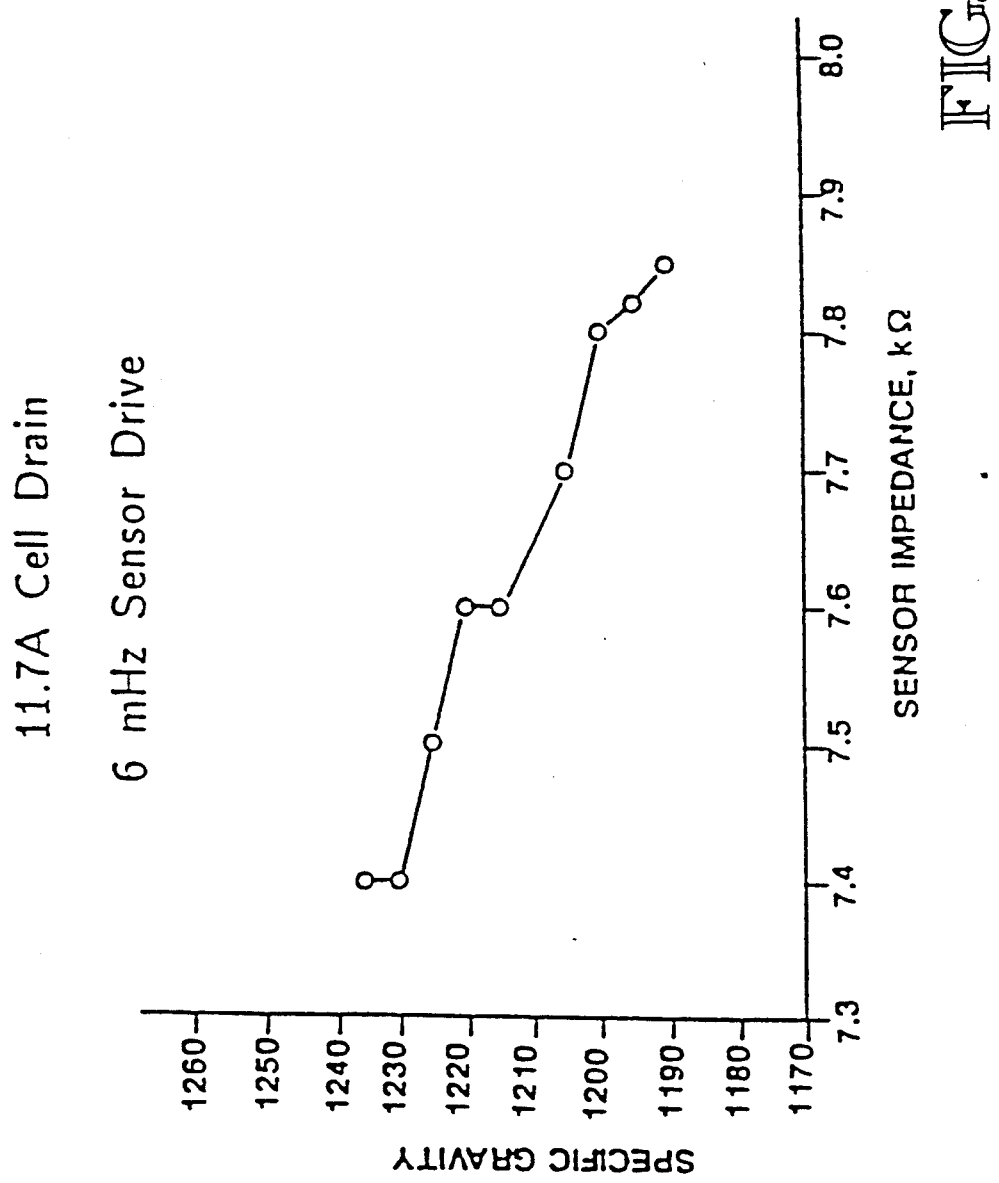
FIG. 8 is a graph depicting the correlation between the sensor impedance and the specific gravity of an electrolytic cell as measured by the second embodiment of the apparatus, as shown in FIG. 4.

FIG. 8 is a graph depicting the correlation between the specific gravity and sensor impedance, according to the parameters of the pair of sense coils 32 and 34. The sensor impedance and specific gravity are approximately inversely related: as the specific gravity of the electrolytic cell decreases, the resonant impedance of the sensor coil increases. The monotonic behavior of the curve plotted in FIG. 8 implies that, over a wide range, specific gravity can be inferred by measurement of the sensor impedance. The sensor impedance can be measured by conventional means, as described above.

Figure 9:
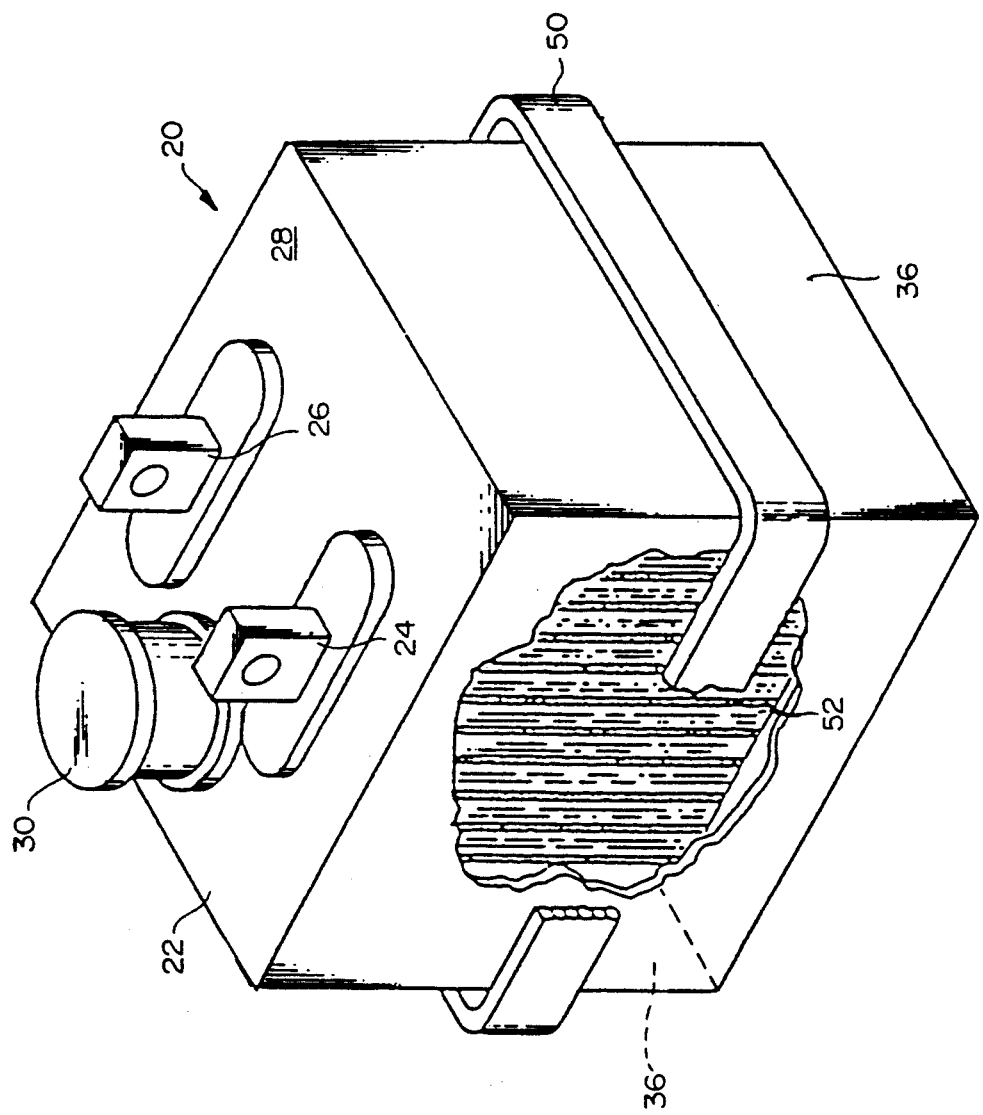
FIG. 9 is a cut-away isometric view of an apparatus for monitoring the state-of-charge of an electrolytic storage cell.

FIG. 9 is a cut-away isometric view that illustrates a state-of-charge monitoring circuit for use with the electrolyte storage cell 20. The cell 20 includes a multi-turn sense coil 50 which is used to monitor the state-of-charge. The coil 50 surrounds the enclosure 22 of the cell 20 in a horizontal plane, and is closely adjacent to the vertical surfaces 36 of the cell 20.

The enclosure 22 of the electrolytic storage cell 20 contains a plurality of vertically parallel plates 52, which, in a lead-acid storage cell, are composed of lead and lead dioxide. Driving the coil 50 by a sinusoidal voltage at a high frequency, in the range of approximately 100 kHz, creates magnetic fields within the enclosure.

The inductance of the coil 50, and hence its resonant frequency, is affected by the state of charge of the cell 20. The magnetic fields imposed by the coil 50 induce currents within the parallel plates 52. The currents reside on the surface of the plates, at a depth that is related to the frequency of excitation of the coil 50. If the skin depth in the plate is less than half the plate's thickness and the skin depth in the electrolyte greater than the width of the storage cell 20, the state-of-charge of the electrolytic storage cell 20 is roughly proportional to the negative change in the inductance of the sense coil 50. The reason is that the inductance change is proportional to the negative of the change in the flux-excluded volume, which is roughly proportional to the change in the electrode volume.

Since the electrically conducting lead plates are partially converted to electrically insulating lead sulfide during cell discharge, the cell's inventory of lead, hence its flux-excluded volume, is a measure of the cell's state of change. Consequently, the state-of-charge is determined from the inductance change, which is measured as the integral, over the volume of the cell 20, of the square of the induced magnetic field (the B-field) within the cell 20.

FIGS. 10A and 10B are schematic diagrams of an embodiment of the apparatus of FIG. 9. As shown in FIG. 10A, the clockwise current through the sense coil 50 passes along its internal portions. This induces the counterclockwise currents along the surfaces of each of the plates 52 to a skin depth which is determined, in part, by the frequency of the voltage imposed on the sense coil 50. The currents are excluded from the lead plates by the skin depth of the circulating currents.

In turn, the induced currents cause the magnetic H-field and the induced magnetic B-field to be created within the electrolytic cell 20. The direction of the induced magnetic field is given by the arrow 54, shown in both FIGS. 10A and 10B.

As shown particularly in FIG. 10B, the concentrated current in the sense coil 50 induces counter currents of substantially the same strength to be induced in the plate 52 which is closest to the sense coil 50.

FIG. 11A is a graph of the specific gravity and the percentage frequency shift in a resonant frequency circuit (shown in FIG. 11B) representing the coil/cell configuration shown in FIGS. 9 and 10, as functions of the amount of charge removed from the electrolytic storage cell 20. The coil 50 is operating at a frequency of 116 kHz and the cell 20 is being discharged at a rate of 40 amperes. It is clear that the frequency shift and specific gravity of a given electrolytic storage cell 20 run closely parallel to one another. Accordingly, it is possible to monitor a range of specific gravities in the cell 20 by measuring the change in the resonant frequency of the cell/coil combination relative to the resonant frequency before the cell was discharged. The signal produced by the coil 50 can be analyzed in terms of its frequency shift to obtain the uniquely related measurement of the specific gravity.

FIG. 11B is the electrical circuit used to obtain the data shown in FIG. 11A. The inductor marked "sensor" represents the inductance of the sense coil 50 shown in both FIGS. 9 and 10. The capacitor 56 was chosen to resonate with the inductance of sensor coil 50 at a frequency of 116 kHz. The value of the resistor 58 was chosen to be equal to the resonant impedance of the parallel tuned circuit 62 composed of the impedance of the sensor coil 50 and the capacitor 56, so that the applied voltage would be roughly equal across both the resistor 58 and the parallel tuned circuit 62 at resonance. As the cell 20 discharged, the inductance of the sensor coil 50 increased, changing the frequency at which the parallel tuned circuit 62 resonated. The frequency shift is the amount by which the applied frequency had to be changed in order to restore resonance. Resonance was determined by maintaining zero phase shift between the resistor 58 and the parallel tuned circuit 62.

FIG. 12 is a schematic diagram of a circuit 70 for monitoring the cell voltage, cell resistance, cell temperature, cell charging/discharging current, and bus-cell connection resistance of the electrolytic storage cell 20. The circuit 70 operates on the principle of a pulse discharge of the storage cell 20 through its terminals 24 and 26, which are attached to the circuit 70. The voltage of the cell 20 powers the voltage/resistance/temperature monitoring circuit 70 of FIG. 12. A converter 72 also converts cell voltage to a form suitable for powering electronic measuring circuitry 74 including voltage-to-frequency converters 76. These converters 76 produce frequencies proportional to signals representing, respectively, the pulse discharge current (between points A and A'), the bus-to-cell connection resistance (through voltages at B and B' and C and C'), the cell resistance (through voltages at C and C'), the cell temperature (through a voltage from the temperature sensor T) and the cell current (through a voltage from the Hall-effect current sensor H).

The voltage-to-frequency converters 76 report sequentially under the control of circuitry 74, whose function is to provide sequential reports of the signals between point pairs A—A', B—B', and C—C', and between points H and T and ground. In this way, a conventional external processor (not shown) may determine respectively, the voltage, bus-cell connection resistance, cell resistance, cell charging/discharging current, and cell temperature. The voltage between points C and C' reflects the cell resistance, while the voltage between points B and B' reflect both the cell resistance and the bus-to-cell connections. Therefore, by subtracting the C voltages from the B voltages, a measure of the bus-to-cell connection resistance can be developed.

Figure 13:
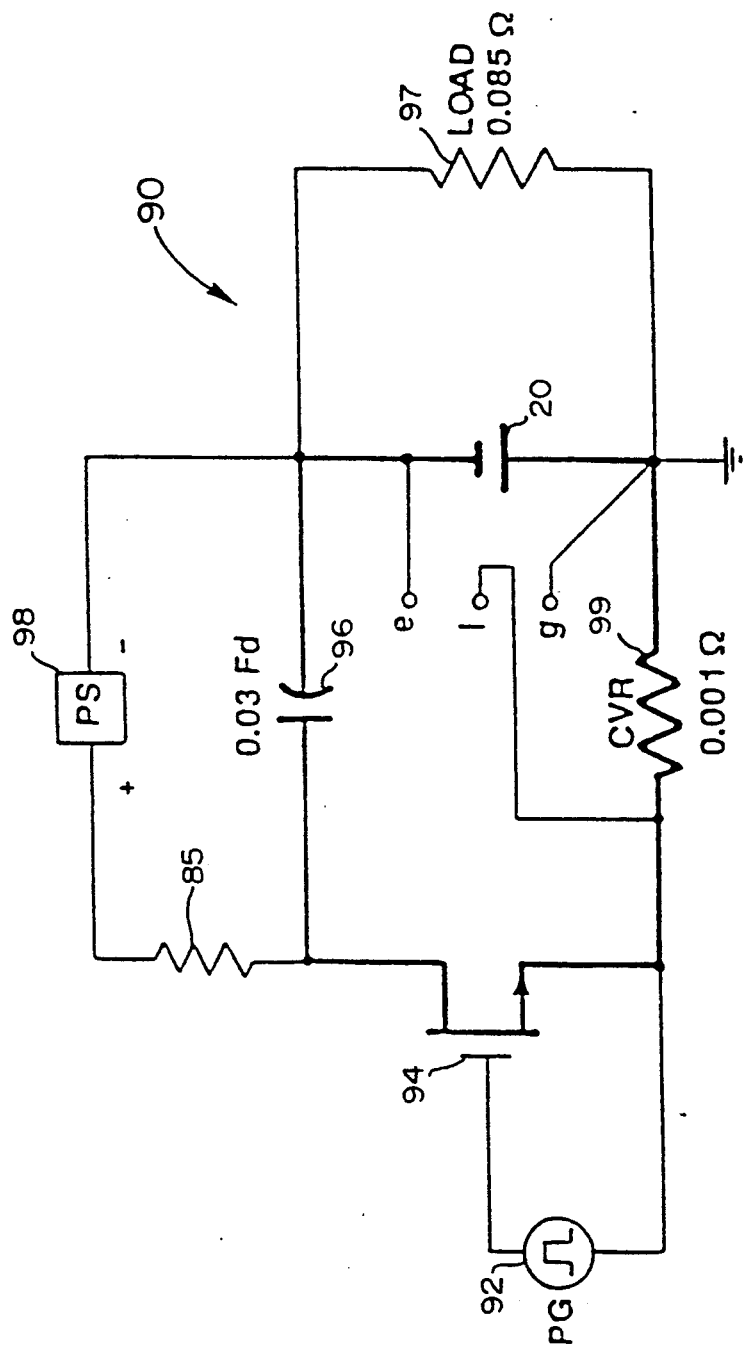
FIG. 13 is a schematic diagram of a circuit useful to test the internal resistance and the bus-cell connection resistance of an electrolytic storage cell.

FIG. 13 is a schematic diagram of a circuit 90 for performing a cell internal resistance test. The test is performed by momentarily activating a switch such as a field-effect transistor 94 with a pulse generator 92 so as to briefly discharge storage capacitor 96 through the cell 20, which is supplying a current through a load resistor 97. The storage capacitor 96 is precharged by power supply 98 before the pulse test is imposed on the cell 20. The current supplied by power supply 98 is limited by the limiting resistor 85. Voltages measured at points e, i, and g can be used to infer the internal resistance of the cell 20 by monitoring the voltage across the cell 20 between points e and g, and monitoring the current through the cell 20 by measuring the voltage imposed across the calibrated resistor 99 between points i and g.

Figure 14:
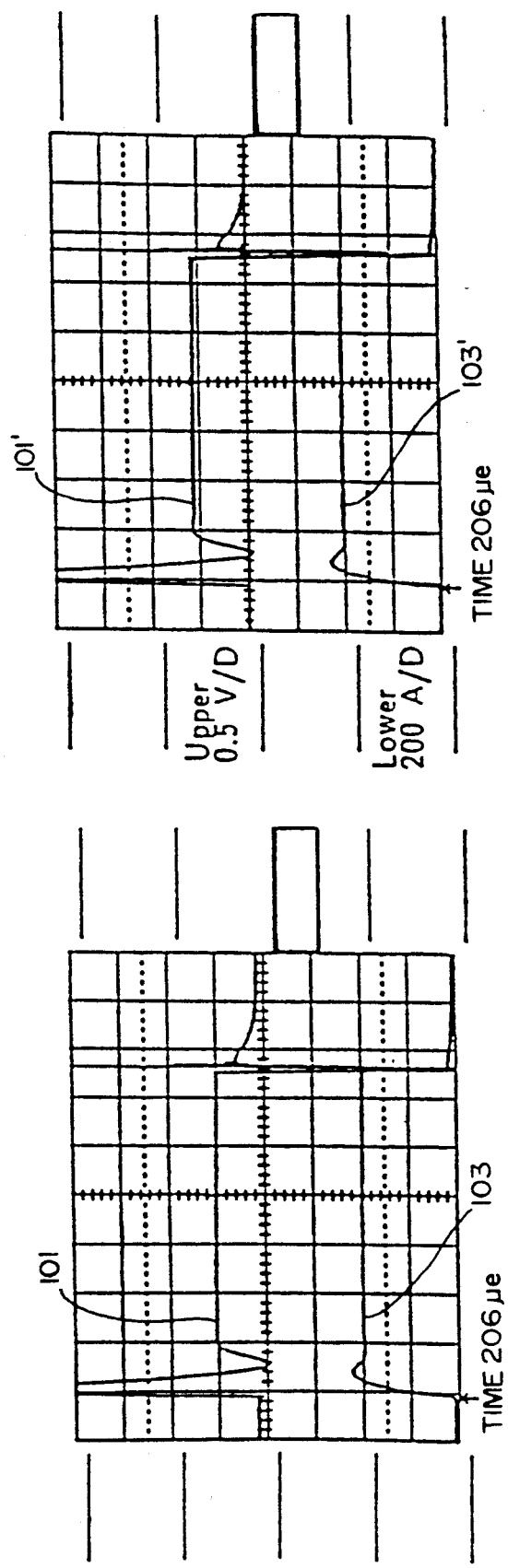
FIG. 14A is a graph of the pulse charge response of a fully charged electrolytic storage cell.
FIG. 14B is a graph of the pulse charge response of an electrolytic storage cell which has been discharged ten percent beyond its rated discharge capacity.

FIG. 14A is a graph of the pulse charge response of a fully charged electrolytic storage cell 20 to the pulse charge test whose circuitry is shown in FIG. 13. In this case, the internal resistance is determined to be 1.10 milliohms. The upper trace 101 in FIG. 14A represents the voltage between points e and g in FIG. 13, while the lower trace 103 represents the voltage between points i and g.

FIG. 14B is a graph of the pulse charge response to a similar pulse charge test performed on the same electrolytic storage cell 20 which has undergone a change in the quantity of charge available by 140 ampere hours (ten percent beyond rated discharge capacity). In this case, the internal resistance has increased to 1.45 milliohms. The upper trace 101' in FIG. 14B represents the voltage between points e and g in FIG. 13, while the lower trace 103' represents the voltage between points i and g. Comparison of the upper traces 101 and 101' in FIGS. 14A and 14B shows that the voltage between the points e and g has increased after the cell 20 has been discharged, while the two lower traces 103 and 103' have not changed. This indicates that the internal resistance of the cell 20 has increased. The amount of the resistance increase can be obtained through a conventional analysis of the four voltages described above.

Figure 15:
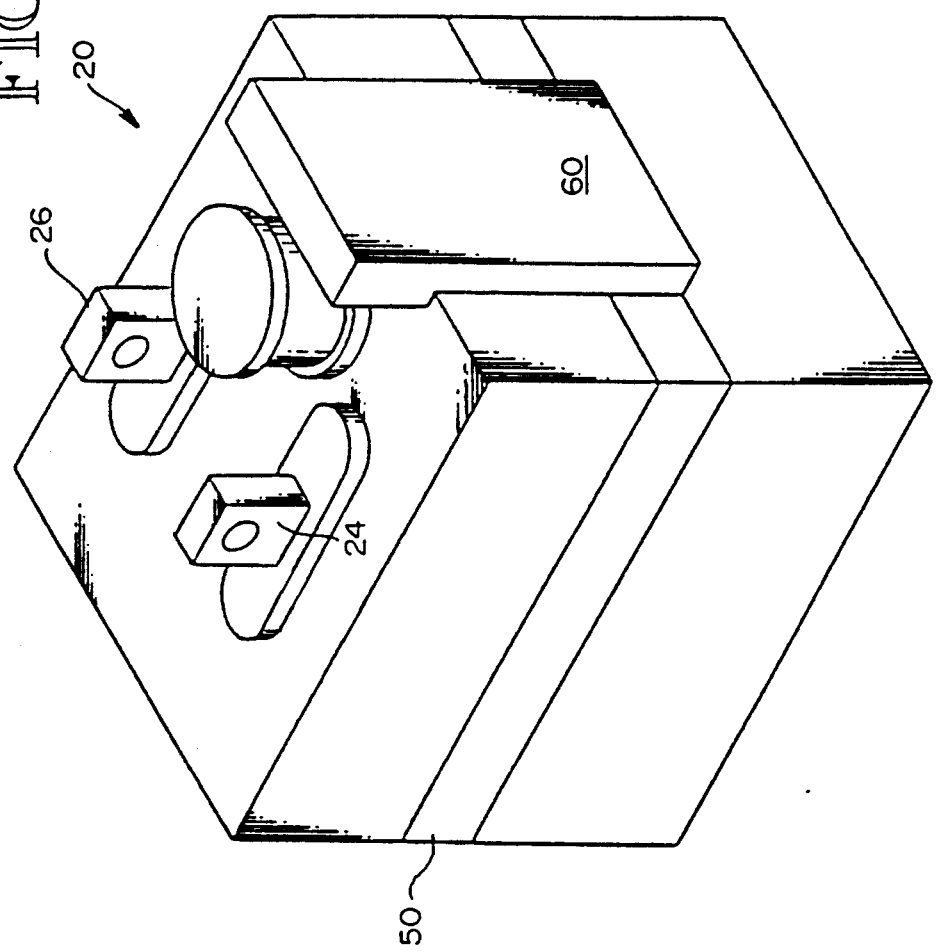
FIG. 15 is an isometric view of an electrolytic storage cell with a multiparameter monitoring package, for use in a cell monitoring system.

FIG. 15 is an isometric view of the electrolytic storage cell 20 with the multi-turn sense coil 50 which is electrically connected to a conventional monitoring module 60. The monitor module 60 contains sensors, signal conditioners, a DC-DC converter, a decoder, and telemetry. Much of this circuitry may be provided by an appropriately programmed conventional microprocessor or microcomputer. The monitoring module 60 can further measure the output voltage, resistance, temperature, electrolyte level, and state-of-charge of a battery storing electrical energy as described above.

Figure 16:
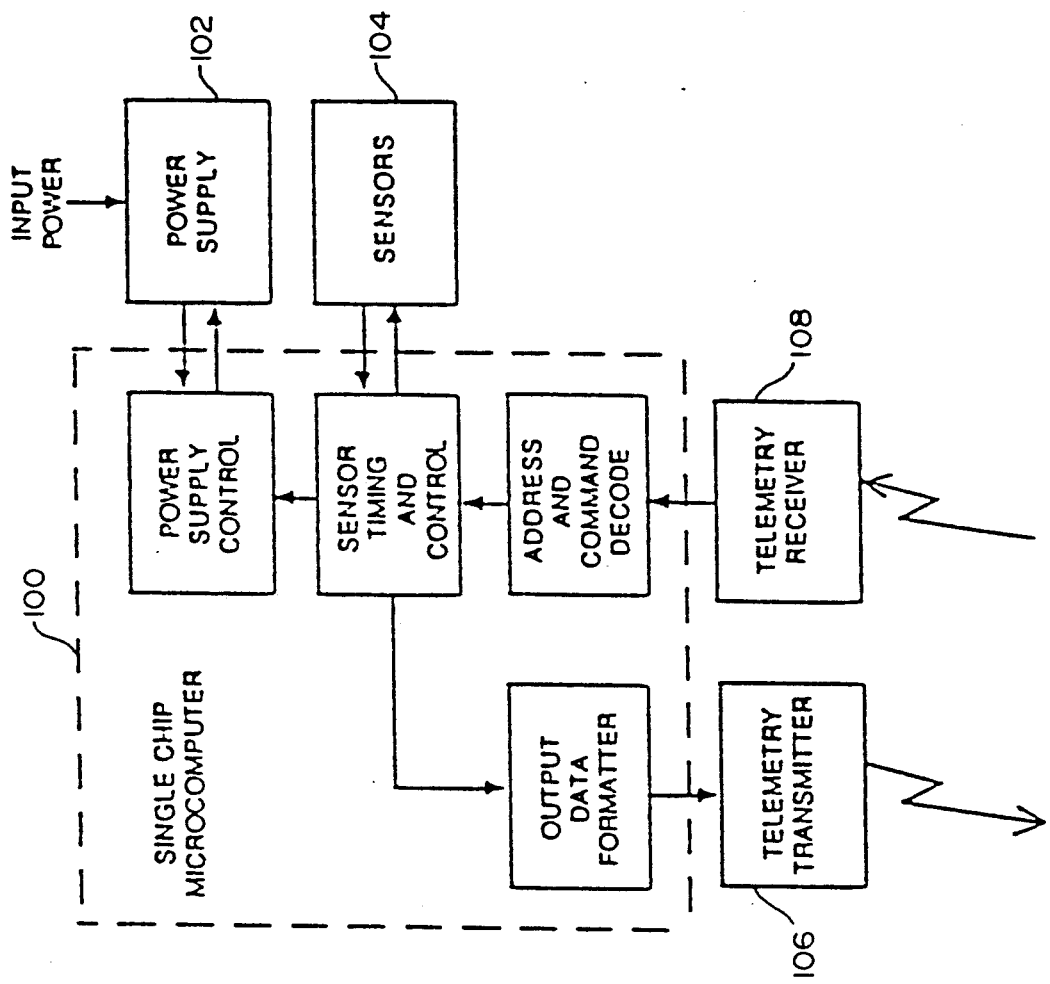
FIG. 16 is a block diagram of one embodiment of the circuitry of the multiparameter monitoring package of FIG. 15.

FIG. 16 is a block diagram of one embodiment of the monitoring module 60. The monitoring module 60 includes a programmed single chip microcomputer 100, an input power supply 102 (DC-to-DC converter) connected to the single chip microcomputer 100, and appropriate sensors 104. In addition, the single chip microcomputer 100, which includes a power supply control, sensor timing and control, and output data formatter, is connected to a conventional telemetry transmitter 106 which can, for example, communicate with the serial-to-telemetry adaptor 95 shown in FIG. 18. In addition, the single chip microcomputer 100 is connected to the telemetry receiver 108 which passes data it receives through an address and command decode circuit to the sensor timing and control circuit. As is clear from FIG. 18, the telemetry transmitter 106 and receiver 108 can be used to establish two-way communications between each individual sensor module 60 and a control computer 93.

Figure 17:
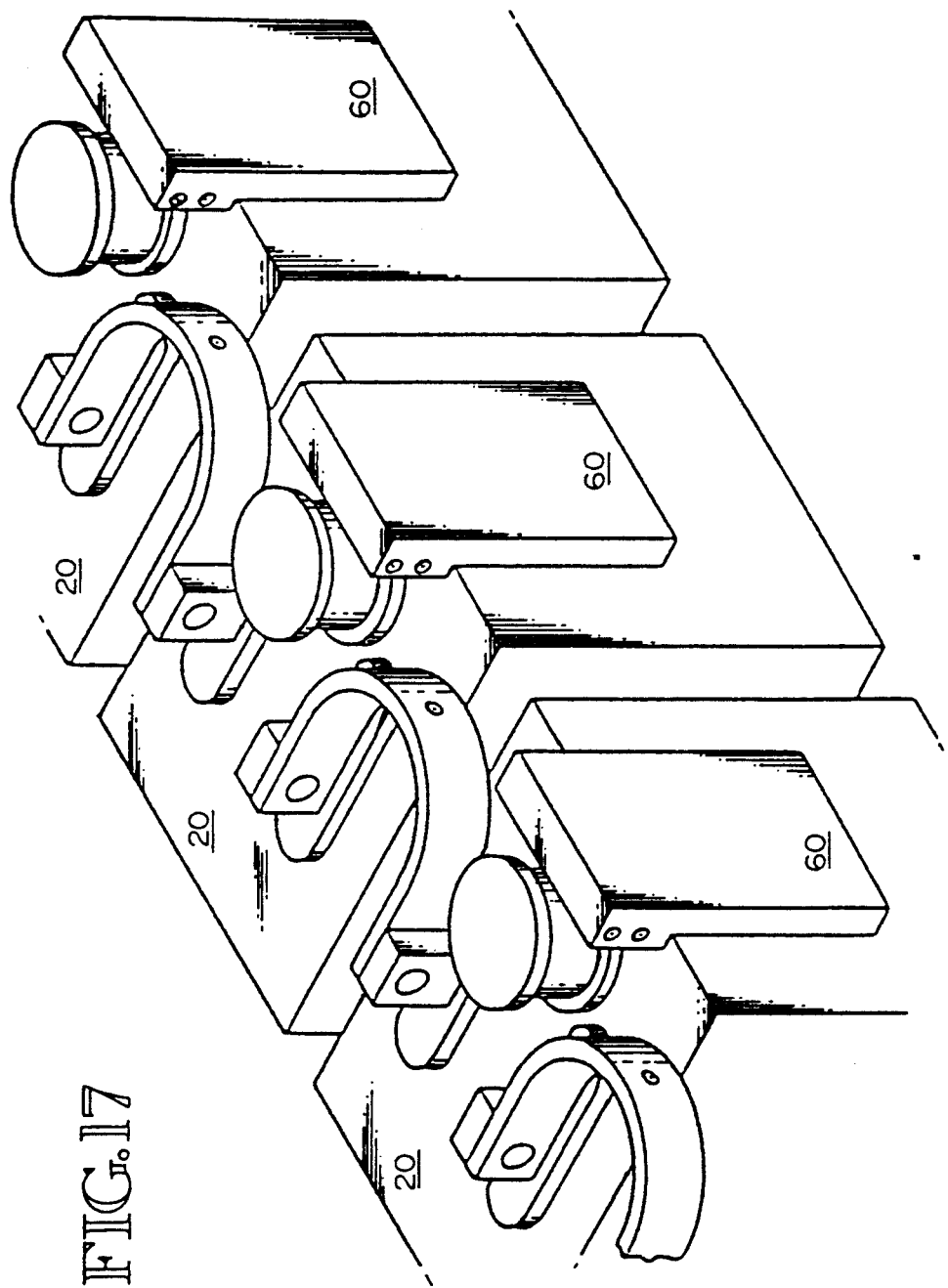
FIG. 17 is a fragmentary isometric view of part of an electrolytic storage cell array equipped with multiparameter monitoring packages of FIG. 15.

FIG. 17 is a fragmentary isometric view of one embodiment of the present invention, whereby a plurality of individual electrolytic storage cells 20, connected together in a series array by their terminals 24 and 26 to produce a relatively high voltage DC current source, are individually equipped with cell monitoring modules 60.

FIG. 18 is a schematic diagram of a comprehensive cell monitoring system according to the present invention. Each of a plurality of the individual electrolytic storage cells 20 has a monitoring module 60 (described above) attached. Each monitoring module 60 is capable of conventional two-way communications with the control computer 93 by way of serial-to-telemetry adaptor 95. The personal computer 93, equivalent to an IBM XT or AT, serves as a central controller and processor for the entire array of electrolytic storage cells 20. If desired, each of the monitoring modules 60 can remain in an "off" or "standby" condition until it is queried in sequence by the control computer 93. For each cell, the control computer 93 will issue an encoded command recognized only by the monitor module 60 of the targeted cell. When commanded, the targeted cell monitoring module 60 will respond by turning on, measuring all parameters, and sending data to the control computer 93. The computer 93 can issue commands to the serial-to-telemetry adaptor 95 which, in turn, will send appropriate signals to the identified electrolytic storage cell 20.

In addition to performing such tasks directed toward monitoring the electrical parameters of the electrolytic storage cells 20, the cell monitoring function can also determine the onset of the evolution of bubbles of gaseous hydrogen in the electrolyte acoustically (through, conventional miniaturized microphones, for example). The function can also maintain automatic cell charge balance among the operating cells 20. This is accomplished by reducing the voltage on those cells 20 whose output voltage is high while increasing the voltage on those cells whose output voltage is low. Such adjustments in cell voltages can be accomplished by adjusting the state-of-charge of each of the cells 20.

An additional cell monitoring function provided by the monitoring module 60 is fluid level maintenance to automatically add water or other electrolytes (through conventional means, which have been automated) to the affected electrolytic storage cell 20. Such fluids may be lost from the cell 20 by evaporation or by being expended by electrolysis during the operation of the cell. A further cell monitoring function is to monitor sediment level in the enclosure 22 of the electrolytic storage cell 20 using SONAR or other conventional principles to measure the thickness of the sediment layer.

While it is clear that those skilled in the art can make various modifications of the embodiments disclosed above, the invention is to be limited only by the following claims.

We claim:

1. A method of determining the state of charge of an electrolytic storage cell, comprising the steps of:
   generating an oscillatory magnetic field from a circulating current that penetrates a predetermined volume of a storage cell having a plurality of metallic electrodes immersed in electrolyte that vary their metallic volume in proportion to the state of charge of said storage cell;
   adjusting the frequency of said oscillatory magnetic field to induce oscillatory currents in said electrolyte and in each of said plurality of electrodes of said storage cell; and
   measuring the change of energy of said magnetic field within said predetermined volume due to the change in said induced oscillatory currents in said plurality of electrodes that is caused by the change in metallic volume of said plurality of metallic electrodes to determine the state of charge of said storage cell.

2. The method set forth in claim 1, wherein said step of generating comprises the step of circulating current through a path defined by a current-circulating conductor that has an inductance, and said step of measuring said change in magnetic field energy comprises the step of determining the change of inductance of said current-circulating conductor due to said change in metallic volume of said plurality of metallic electrodes.

3. The method set forth in claim 2 wherein said step of generating comprises generation of said magnetic field to penetrate substantially of all of the electrolyte of said storage cell within said predetermined volume of said magnetic field.

4. The method set forth in claim 3, wherein said step of adjusting the frequency of said oscillatory magnetic field comprises adjustment of the frequency of said magnetic field to cause said induced oscillatory currents to flow upon the surfaces of each of said plurality of electrodes of said storage cell by magnetic flux exclusion that penetrates each of said plurality of electrodes with said induced currents to a skin depth that is inversely proportional to the square root of the frequency of said magnetic field.

5. The method set forth in claim 4, wherein said step of adjusting the frequency of said magnetic field comprises adjustment of the frequency of said magnetic field to diffuse at least a portion of said generated magnetic field within a predetermined frequency range through a skin depth in said electrolyte that is at least as wide as half of the width of said storage cell.

6. The method set forth in claim 5, wherein said step of generating said magnetic field comprises generation of said magnetic field to be substantially incident upon the surfaces of said plurality of electrodes and said step of adjusting comprises adjustment of the frequency of said generated magnetic field into each of said plurality of electrodes to diffuse said magnetic field to a skin depth that is no more than approximately half of the thickness of each of said plurality of electrodes.

7. Apparatus for determining the state of charge of an electrolytic storage cell, comprising:

means for generating an oscillatory magnetic field from a circulating current that penetrates a predetermined volume of a storage cell having a plurality of metallic electrodes immersed in electrolyte that vary their metallic volume in proportion to the state of charge of said storage cell;

means for adjusting the frequency of said oscillatory magnetic field to induce oscillatory currents in said electrolyte and in each of said plurality of electrodes of said storage cell; and means for measuring the change of energy of said magnetic field within said predetermined volume due to the change in said induced oscillatory currents in said plurality of electrodes that is caused by the change in metallic volume of said plurality of metallic electrodes to determine the state of charge of said storage cell.

8. The apparatus set forth in claim 7, wherein said means for generating comprises means for circulating current through a path defined by a current-circulating conductor that has an inductance, and said means for measuring said change in magnetic field energy comprises means for determining the change of inductance of said current-circulating conductor due to said change in metallic volume of said plurality of metallic electrodes.

9. The apparatus set forth in claim 8, wherein said means for generating generates said magnetic field to penetrate substantially of all of the electrolyte of said storage cell within said predetermined volume of said magnetic field.

10. The apparatus set forth in claim 9, wherein said means for generating induces said oscillatory currents to flow upon the surfaces of each of said plurality of electrodes of said storage cell by magnetic flux exclusion that penetrates each of said plurality of electrodes with said induced currents to a skin depth that is inversely proportional to the square root of the frequency of said magnetic field.

11. The apparatus set forth in claim 10, wherein said means for adjusting the frequency of said magnetic field adjusts the frequency of said magnetic field to diffuse at least a portion of said generated magnetic field within a predetermined frequency range through a skin depth in said electrolyte that is at least as wide as half of the width of said storage cell.

12. The apparatus set forth in claim 11, wherein said means for generating said magnetic field orients said magnetic field to be substantially parallel to and incident upon the surfaces of said plurality of electrodes and diffuses said generated magnetic field into each of said plurality of electrodes to a skin depth that is no more than approximately half of the thickness of each of said plurality of electrodes.

13. The apparatus set forth in claim 7, wherein said means for generating comprises an impulse-excited resonant circuit.

14. The apparatus set forth in claim 13, wherein said resonant circuit comprises an inductor and a capacitor.

15. The apparatus set forth in claim 14, wherein said resonant circuit is a parallel resonant circuit.

16. The apparatus set forth in claim 15, wherein said inductor encompasses the perimeter of said storage cell.

17. The apparatus set forth in claim 16, wherein said means for measuring comprises an impedance bridge.

18. The apparatus set forth in claim 16, wherein said means for measuring comprises a frequency meter.

19. The apparatus set forth in claim 7, wherein said means for generating comprises an oscillator having a tank circuit in its feedback path that comprises an inductor and a capacitor.

20. The apparatus set forth in claim 19, wherein said tank circuit is a parallel resonant circuit.

21. The apparatus set forth in claim 20, wherein said inductor encompasses the perimeter of said storage cell.

22. The apparatus set forth in claim 21, wherein said means for measuring comprises a frequency meter.

23. The apparatus set forth in claim 20, wherein said means for generating comprises an inductor that encompasses the perimeter of said storage cell.

* * * * *